(12) United States Patent
Shin et al.

(10) Patent No.: US 10,416,501 B2
(45) Date of Patent: Sep. 17, 2019

(54) DISPLAY DEVICE AND MANUFACTURING METHOD THEREOF

(71) Applicant: Samsung Display Co. Ltd., Yongin-si, Gyeonggi-do (KR)

(72) Inventors: Jin Soo Shin, Suwon-si (KR); Jun Hee Son, Asan-si (KR); Wee Joon Jeong, Seongnam-si (KR); Seong Yong Hwang, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/982,966

(22) Filed: May 17, 2018

(65) Prior Publication Data

US 2019/0025621 A1    Jan. 24, 2019

(30) Foreign Application Priority Data

Jul. 19, 2017  (KR) .......................... 10-2017-0091361

(51) Int. Cl.
| | | |
|---|---|---|
| *G02F 1/1339* | (2006.01) | |
| *G02F 1/1335* | (2006.01) | |
| *G02F 1/017* | (2006.01) | |
| *H01L 33/50* | (2010.01) | |

(52) U.S. Cl.
CPC ............ *G02F 1/1339* (2013.01); *G02F 1/017* (2013.01); *G02F 1/133512* (2013.01); *G02F 1/133514* (2013.01); *G02F 1/133528* (2013.01); *G02F 1/133602* (2013.01); *H01L 33/502* (2013.01); *G02F 2001/01791* (2013.01)

(58) Field of Classification Search
CPC .......................... G02F 1/1339; G02F 1/133533
See application file for complete search history.

(56) References Cited

U.S. PATENT DOCUMENTS

| | | | | |
|---|---|---|---|---|
| 7,819,539 B2* | 10/2010 | Kim | ...................... | H01L 33/507 313/110 |
| 9,182,535 B2* | 11/2015 | Lee | ................... | G02F 1/133308 |
| 9,199,842 B2* | 12/2015 | Dubrow | ................. | B82Y 20/00 |
| 9,322,961 B2* | 4/2016 | Lee | ................... | G02F 1/133603 |
| 9,335,459 B2* | 5/2016 | Kang | ....................... | G02B 5/23 |
| 9,470,399 B1* | 10/2016 | Skipor | .................. | G02F 1/1336 |
| 9,482,900 B2* | 11/2016 | Yun | ....................... | G02B 6/0055 |
| 9,709,726 B2* | 7/2017 | Yonezawa | ............. | G02F 1/1333 |
| 9,874,661 B2* | 1/2018 | Lee | .......................... | G02B 1/18 |

(Continued)

FOREIGN PATENT DOCUMENTS

| KR | 10-2016-0034481 A | 3/2016 |
|---|---|---|
| KR | 10-2016-0049082 A | 5/2016 |
| KR | 10-2017-0018185 A | 2/2017 |

*Primary Examiner* — Rhonda S Peace
(74) *Attorney, Agent, or Firm* — Innovation Counsel LLP

(57) ABSTRACT

A display device and a manufacturing method of a display device are provided. The display device comprises: an optically functional layer including a wavelength conversion material; a display panel disposed on the optically functional layer and having at least one side which protrudes outward from an edge of the optically functional layer; and a sealing member surrounding a side surface of the optically functional layer and disposed such that at least a portion of the sealing member is in contact with a lower surface of the protruding portion of the display panel, wherein the sealing member includes a light shielding material that substantially blocks visible light.

18 Claims, 17 Drawing Sheets

(56) References Cited

U.S. PATENT DOCUMENTS

| | | | |
|---|---|---|---|
| 9,957,421 B2 * | 5/2018 | Ito | F21V 9/30 |
| 10,093,853 B2 * | 10/2018 | Yagihashi | C09K 11/7731 |
| 2014/0375938 A1 | 12/2014 | Meyers et al. | |
| 2016/0154271 A1 * | 6/2016 | Kim | G02F 1/133308 |
| | | | 349/58 |
| 2017/0192304 A1 * | 7/2017 | Matsuura | G02B 6/0031 |
| 2017/0242287 A1 * | 8/2017 | Park | G02F 1/133308 |
| 2018/0170009 A1 * | 6/2018 | Kuniyasu | B32B 3/02 |

* cited by examiner

DISPLAY DEVICE AND MANUFACTURING METHOD THEREOF

CROSS-REFERENCE TO RELATED APPLICATION

This application claims priority to Korean Patent Application No. 10-2017-0091361 filed on Jul. 19, 2017 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device and a manufacturing method thereof.

2. Description of the Related Art

A liquid crystal display device is a light receiving display device which receives light from a separate light source and displays an image. The light emitted from the light source can be transmitted to a liquid crystal display panel through a light guide plate, an optical sheet and the like.

Recently, researches on an application of a wavelength conversion material have been conducted to improve image quality such as color reproducibility of a liquid crystal display device. A blue light source is usually used as a light source, and a wavelength conversion material is disposed on the upper side of the light guide plate to convert the light into white light.

Since the wavelength conversion material is generally vulnerable to oxygen and moisture, the wavelength conversion material is sealed with a protective film or the like. Generally, a sheet is manufactured to have a large area by coating a wavelength conversion material between two protective films, and the sheet is cut and used as necessary for each display device model.

However, since the side surface, i.e., the cut surface, of the layer formed by coating the wavelength conversion material is not covered by the upper and lower protective films, it may be exposed to the outside and may be degraded by oxygen or moisture.

SUMMARY

Aspects of the present disclosure provide a display device capable of preventing degradation due to oxygen or moisture that may infiltrate into a wavelength conversion material in a lateral direction and a manufacturing method thereof.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

Embodiments of the present disclosure provide at least the following effects.

By using a sealing member disposed on the side surface of a layer including the wavelength conversion material, it is possible to prevent the wavelength conversion material from being exposed to oxygen or moisture and being damaged.

Further, by forming the sealing member in black, it is possible to prevent a bluish phenomenon in which original light emitted from the light source is visually perceived as it is on the screen.

An exemplary embodiment of the present inventive concept discloses a display device comprising: an optically functional layer including a wavelength conversion material, a display panel disposed on the optically functional layer and having at least one side which protrudes outward from an edge of the optically functional layer, and a sealing member surrounding a side surface of the optically functional layer and disposed such that at least a portion of the sealing member is in contact with a lower surface of the protruding portion of the display panel. The sealing member may include a light shielding material that substantially blocks visible light.

The optically functional layer may include a protective layer, and a wavelength conversion layer disposed between the protective layer and the display panel and including the wavelength conversion material.

The optically functional layer may further include an optical sheet layer disposed between the wavelength conversion layer and the display panel and including a laminate of at least one of a polarizing film, a prism film and a light scattering film.

The display device may include an auxiliary sealing member disposed between the sealing member and the wavelength conversion layer to surround at least one side surface of the wavelength conversion layer, the auxiliary sealing member being in contact with the sealing member, the wavelength conversion layer and the protective layer.

The auxiliary sealing member may have a viscosity lower than that of the sealing member.

The display device may further include a passivation film disposed to cover exposed surfaces of the optically functional layer and the sealing member.

The one side of the display panel may protrude outward from the sealing member and the passivation film may be disposed such that at least a portion of the passivation film is in contact with a lower surface of the protruding portion of the display panel.

The passivation film may include silicon oxide ($Si_xO_y$) and/or aluminum oxide ($Al_xO_y$).

The wavelength conversion material may include a quantum dot.

The light shielding material may include a black polymer resin.

An exemplary embodiment of the present inventive concept discloses a display device comprising: a backlight unit including a light source and a light guide plate disposed on one side of the light source, an optically functional layer disposed on the light guide plate and including a protective layer and a wavelength conversion layer disposed on the protective layer, a display panel disposed on the optically functional layer, and a sealing member disposed to surround at least one side surface of the protective layer and the wavelength conversion layer. The sealing member may include a light shielding material that substantially blocks visible light.

The display device may further include a low refraction layer disposed between the light guide plate and the protective layer and having a refractive index lower than that of the light guide plate.

The wavelength conversion layer may include a quantum dot.

The display device may further include a passivation film disposed to cover exposed surfaces of the optically functional layer and the sealing member.

The light shielding material may include a black polymer resin.

An exemplary embodiment of the present inventive concept discloses a manufacturing method of a display device comprising: preparing a display panel on which a display element including a thin film transistor is mounted, attaching, on the display panel, at least one optical sheet selected from the group consisting of an anti-reflection film, a prism film and a light scattering film, forming a wavelength conversion layer by coating a wavelength conversion material on the optical sheet, forming a protective layer on the wavelength conversion layer, coating a curable resin to cover side surfaces of the optical sheet, the wavelength conversion layer and the protective layer, and curing the curable resin to form a sealing member.

The method may further include forming a passivation film to cover exposed surfaces of the protective layer and the sealing member by depositing an inorganic material.

The inorganic material may include silicon oxide ($Si_xO_y$) and/or aluminum oxide ($Al_xO_y$).

The wavelength conversion material may include a quantum dot.

The curable resin may include a black photo-curable resin.

The effects of the present disclosure are not limited to the above-described effects and other effects which are not described herein will become apparent to those skilled in the art from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
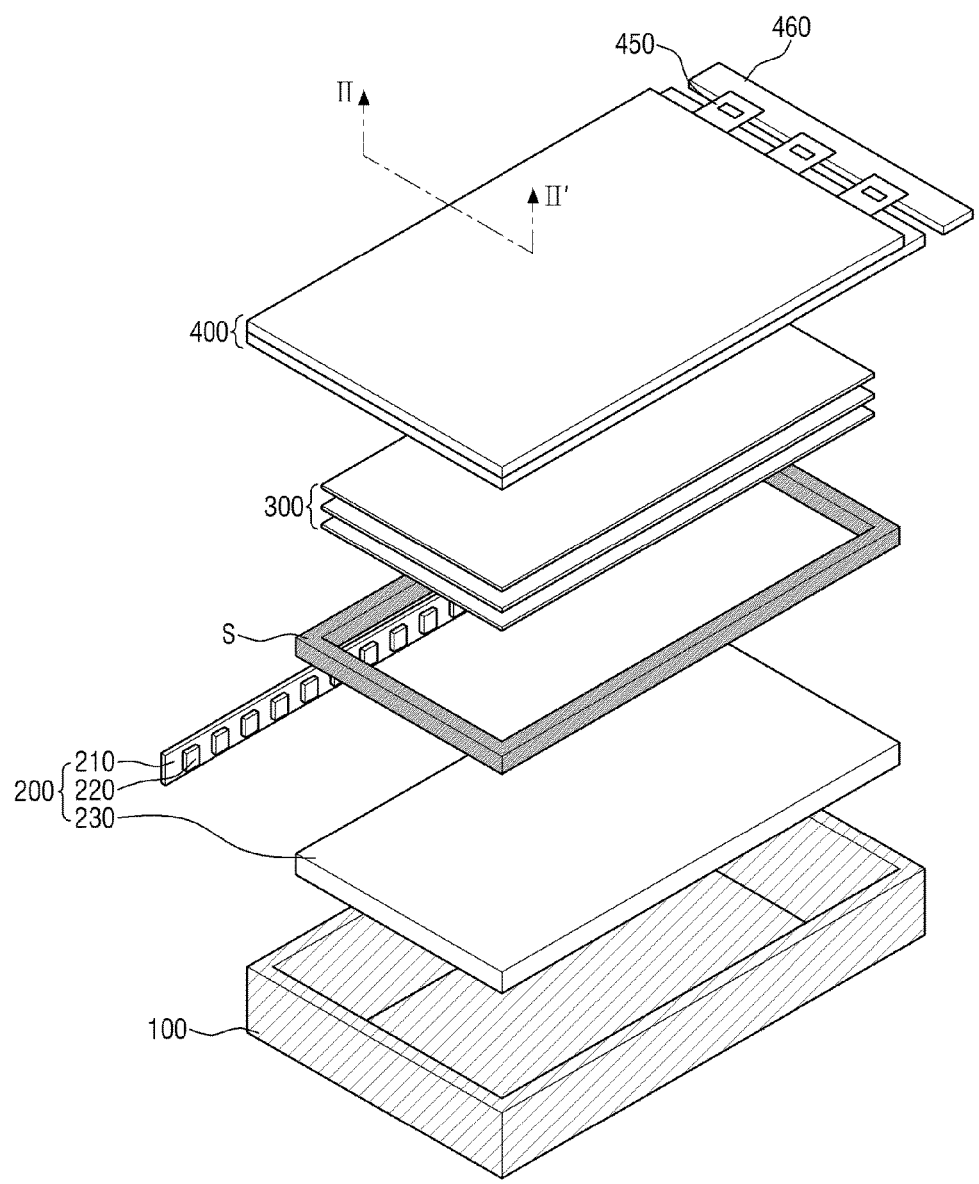
FIG. 1 is an exploded perspective view of a display device according to an embodiment of the present disclosure.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from the element, component, region, layer or section. Thus, a first element, component, region, layer or section discussed below could be termed a second element, component, region, layer or section departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below.

Hereinafter, embodiments of the present disclosure will be described with reference to the accompanying drawings.

A display device according to embodiments of the present disclosure may be a light receiving display device such as a liquid crystal display device or an electrophoretic device. Hereinafter, a liquid crystal display device having a narrow bezel, wherein a top cover or chassis covering a part of an upper portion of the display device is removed, will be described as an example, but the present disclosure is not limited thereto.

Figure 2:
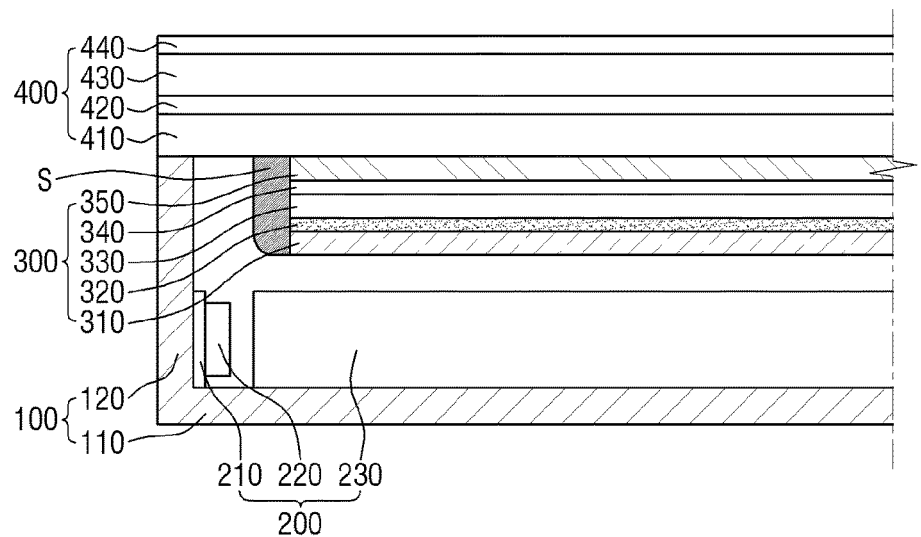
FIG. 2 is a cross-sectional view of the display device taken along line II-II' of FIG. 1.

FIG. 1 is an exploded perspective view of a display device according to an embodiment of the present disclosure. FIG. 2 is a cross-sectional view of the display device taken along line II-II' of FIG. 1.

Referring to FIGS. 1 and 2, the display device includes a display panel 400, an optically functional layer 300 and a sealing member S. The display device may further include a housing 100 and a backlight unit 200.

The display panel 400 is a panel-shaped member including display elements such as a thin film transistor (TFT), a liquid crystal and a color filter to display a screen. The display panel 400 may be a light receiving display panel which receives light from the backlight unit 200 and displays a screen. As examples of the light receiving display panel, a liquid crystal display panel, an electrophoretic display panel and the like may be mentioned. In the following description, a liquid crystal display panel is exemplified as the display panel 400, but various display panels can be applied without being limited thereto.

The display panel 400 may include a first substrate 410, a second substrate 430, and a liquid crystal layer 420 interposed between the first substrate 410 and the second substrate 430.

The first substrate 410 may be a TFT array substrate including a thin film transistor. The second substrate 430 may include a color filter. An upper polarizing layer 440 may be disposed on the second substrate 430. The first substrate 410 and the second substrate 430 may face and overlap each other. In one embodiment, any one of the substrates may be larger than the other substrate and protrude further outward. In the drawing, it is illustrated that one side surface of the first substrate 410 located at the lower side protrudes further outward. A printed circuit board 460 may be connected to a protruding region of the first substrate 410 via a connection member 450 such as a flexible circuit board or a tape carrier package (TCP). The printed circuit board 460 may be suitably bent and brought into contact with a side surface or back surface of the display panel 400 during a modularization process.

The optically functional layer 300 may be disposed on one surface of the display panel 400. Specifically, the optically functional layer 300 may be attached on the lower surface of the display panel 400. The optically functional layer 300 may perform optical functions such as optical diffusion, anti-reflection, polarization and phase conversion in combination.

The optically functional layer 300 may be disposed such that at least one side thereof is retracted inward from the same side of the display panel 400. That is, at least one side of the display panel 400 may protrude outward from the same side of the optically functional layer 300. The optically functional layer 300 and the display panel 400 may be arranged such that some sides thereof are retracted/protruded from each other, or all sides thereof are retracted/protruded from each other. In this case, the optically functional layer 300 is formed to have a smaller area than the display panel 400 in a plan view, and the edge of the optically functional layer 300 is positioned more inward than the edge of the display panel 400 in a cross-sectional view.

The optically functional layer 300 may include a lower polarizing layer 350, an adhesive layer 340, an optical sheet layer 330, a wavelength conversion layer 320, and a protective layer 310.

The lower polarizing layer 350 is disposed on the lower surface of the display panel 400. The lower polarizing layer 350 may be attached to the display panel 400 through a separate adhesive member or may be formed directly on the display panel 400. The lower polarizing layer 350 serves to polarize light provided from the backlight unit 200.

The adhesive layer 340 is disposed on the lower surface of the lower polarizing layer 350. The adhesive layer 340 may allow the components of the optically functional layer 300 to be attached to the lower polarizing layer 350. The adhesive layer 340 may include an optical clear adhesive (OCA) or an optical clear resin (OCR). Further, the optical clear adhesive and the optical clear resin may be a pressure sensitive adhesive (PSA). However, the present disclosure is not limited thereto.

The optical sheet layer 330 is disposed on the lower surface of the adhesive layer 340. The optical sheet layer 330 may be attached to the lower polarizing layer 350 through the adhesive layer 340. The optical sheet layer 330 may be a laminate of at least one of a prism film and a light scattering film. The number and stacking order of films of the optical sheet layer 330 are not limited particularly. However, preferably, a prism film and a light scattering film may be sequentially stacked, or two prism films may be stacked between the lower polarizing layer and a light scattering film.

The optical sheet layer 330 may include members having various optical functions, such as a diffusion film, a microlens film, a lenticular film and a retardation film, in addition to the above-mentioned films. The optical sheet layer 330 may not be disposed on the display panel 400 but may be disposed on a light guide plate 230. In this case, the wavelength conversion layer 320 is directly disposed on the display panel 400.

The wavelength conversion layer 320 is disposed on the lower surface of the optical sheet layer 330. The wavelength conversion layer 320 may be a layer formed by coating a wavelength conversion material. The wavelength conversion material is a material for converting the wavelength of incident light, and may be, for example, a quantum dot (QD), a fluorescent material or a phosphorescent material. As an example of the wavelength conversion material, the quantum dot, which is a material having a crystal structure of several nanometers in size, is made up of hundreds to thousands of atoms. Because of its small size, the quantum dot exhibits a quantum confinement effect in which the energy band gap increases. When light of a wavelength with energy higher than the band gap is incident on the quantum dot, the quantum dot is excited by absorption of the light and falls to a ground state while emitting light of a specific wavelength. The emitted light of the specific wavelength has a value corresponding to the band gap. The quantum dot may control the luminescence characteristics due to the quantum confinement effect by adjusting the size and composition thereof.

The quantum dot include, for example, at least one of Group II-VI compounds, Group II-V compounds, Group III-VI compounds, Group III-V compounds, Group IV-VI compounds, Group I-III-VI compounds, Group II-IV-VI compounds and Group II-IV-V compounds.

The quantum dot may include a core and a shell which overcoats the core. The core may be, but not limited to, at least one of, for example, CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si and Ge. The shell may be, but not limited to, at least one of, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe and PbTe.

The wavelength conversion material may include a plurality of wavelength conversion materials for converting incident light into lights of different wavelengths. For example, the wavelength conversion material may include a first wavelength conversion material which converts incident light of a specific wavelength into light of a first wavelength and emits the converted light, and a second wavelength conversion material which converts incident light of a specific wavelength into light of a second wavelength and emits the converted light. In an exemplary embodiment, the light emitted from the backlight unit 200 and incident on the wavelength conversion material may have a blue wavelength, the first wavelength may be a green wavelength, and the second wavelength may be a red wavelength. For example, the blue wavelength is a wavelength having a peak at 420 nm to 470 nm, the green wavelength is a wavelength having a peak at 520 nm to 570 nm, and the red wavelength may be a wavelength having a peak at 620 nm to 670 nm. However, the blue, green, and red wavelengths are not limited to the above examples, and should be understood to include all wavelength ranges that can be perceived as blue, green, and red lights in the art.

In the exemplary embodiment, a portion of the blue light incident on the wavelength conversion layer 320 may be incident on the first wavelength conversion material and converted into light of a green wavelength and another portion of the blue light may be incident on the second wavelength conversion material and converted into light of a red wavelength while passing through the wavelength conversion layer 320, and the remaining portion may be emitted without being incident on the first and second wavelength conversion materials. Therefore, the light which has passed through the wavelength conversion layer 320 includes all of light having a blue wavelength, light having a green wavelength and light having a red wavelength. If the ratio of the emitted lights of different wavelengths is appropriately adjusted, light of white or other colors may be emitted and displayed. The lights converted by the wavelength conversion layer 320 are concentrated within a narrow range of specific wavelengths, and have a sharp spectrum with a narrow half width. Therefore, when the light of such a spectrum is filtered by the color filter to implement the color, color reproducibility can be improved.

Unlike the above exemplary embodiment, incident light may be short-wavelength light such as ultraviolet light, and three types of wavelength conversion materials for converting incident light into lights of blue, green and red wavelengths may be disposed in the wavelength conversion layer 320 to emit white light.

The wavelength conversion layer 320 may further include scattering particles. The scattering particles may be non-quantum dot particles, which have no wavelength conversion function. The scattering particles scatter the incident light so that more incident light can be incident on the wavelength conversion material. In addition, the scattering particles may serve to uniformly control an emission angle of light for each wavelength. More specifically, the scattering particles may have scattering characteristics which distribute emission directions of the converted light randomly. If there are no scattering particles in the wavelength conversion layer 320, green light and red light may be scattered randomly because the green light and the red light is emitted after the collision with the wavelength conversion material, but blue light emitted without colliding with the wavelength conversion material may not be scattered randomly. Accordingly, the amount of emitted light of blue/green/red wavelengths will be different depending on the angle of emission. The scattering particles may scatter the blue light emitted without colliding with the wavelength conversion material, so that the emission angle of light for each wavelength can be similarly controlled. As the scattering particles, $TiO_2$, $SiO_2$ or the like may be used.

The protective layer 310 is disposed on the lower surface of the wavelength conversion layer 320. Since the wavelength conversion material, particularly the quantum dot, included in the wavelength conversion layer 320 may be easily degraded by moisture and oxygen, the protective layer 310 is disposed to cover the exposed lower surface of the wavelength conversion layer 320, thereby protecting the wavelength conversion material. The protective layer 310 may be a film made of a material capable of blocking moisture and oxygen, but is not limited thereto.

The sealing member S may be disposed so as to surround the side surface of the optically functional layer 300. Specifically, the sealing member S may be disposed so as to cover all of the side surfaces of the lower polarizing layer 350, the optical sheet layer 330, the wavelength conversion layer 320 and the protective layer 310. As described above, since at least one side of the display panel 400 may protrude more outward than the same side of the optically functional layer 300 disposed on the same side as the one side, in the protruding portion of the display panel 400, the upper surface of the sealing member S and the surface (i.e., the lower surface) of the display panel 400 facing the optically functional layer 300 may be in contact with each other.

The sealing member S may include a material capable of blocking oxygen and/or moisture (hereinafter, referred to as 'oxygen/moisture'). Specifically, the sealing member S may include an acrylic polymer resin, but is not limited thereto. The sealing member S may include any resin having a characteristic of sufficiently blocking oxygen/moisture.

The protective layer 310 and the optical sheet layer 330 may seal the upper and lower surfaces of the wavelength conversion layer 320, thereby protecting the wavelength conversion material from oxygen/moisture infiltrating in a vertical direction. However, the protective layer 310 and the optical sheet layer 330 cannot protective the wavelength conversion layer 320 from being contacting oxygen/moisture infiltrating in a lateral direction. Therefore, by disposing the sealing member S for sealing the side surface of the wavelength conversion layer 320, the wavelength conversion material can also be protected from oxygen/moisture in the lateral direction.

The material included in the sealing member S may be a material having adhesive property. That is, the material for blocking oxygen/moisture may be a material also having the adhesive property. The exemplified polymer resin may be a material which not only blocks oxygen/moisture, but also has the adhesive property. However, without being limited thereto, the sealing member S may further include a material having the adhesive property in addition to a material for blocking oxygen/moisture. That is, the sealing member S may be a mixture of a polymer resin having an oxygen/moisture blocking property and a polymer resin having the adhesive property.

The optical sheet layer 330 and the protective layer 310 may be adhered to each other through the wavelength conversion layer 320 formed by coating the wavelength conversion material, but the adhesion may be insufficient to achieve complete attachment and fixation. Therefore, it is possible to maintain strong adhesion through the sealing member S which is simultaneously in contact with and attached to the side surfaces of the optical sheet layer 330 and the protective layer 310, and it is possible to minimize the number of adhesive layers 340 disposed between the respective layers in the optically functional layer 300. In addition, since the sealing member S may also be in contact with and attached to the lower surface of the display panel 400, the adhesion between the optically functional layer 300 and the display panel 400 can be secured.

The sealing member S may include a light shielding material. The light shielding material may be a material having a color (e.g., black, blue, etc.) that substantially blocks the transmission of visible light. To substantially block the transmission of visible light may mean absorbing or blocking most wavelengths included in the visible light or wavelengths including a specific wavelength. The specific wavelength may be a wavelength of light emitted from the light source 220. The sealing member S may include the light shielding material in a sufficient viscosity or concentration, thereby blocking the transmission of visible light.

The above-exemplified polymer resin may be a black resin which blocks oxygen/moisture, exhibits the adhesive property, and substantially blocks visible light. However, without being limited thereto, the sealing member S may be a mixture of a polymer resin which blocks oxygen/moisture or has the adhesive property and a polymer resin having a color which blocks visible light.

When original light emitted from the light source 220 is incident on the side surfaces of the wavelength conversion layer 320, the optical sheet layer 330 and the like through the backlight unit 200 or is transmitted and emitted through the side surfaces thereof, the original light may be visually perceived as it is on the screen of the display panel 400. In particular, when the light source 220 emits blue light, the blue light may be visually perceived on the screen of the display panel 400. Therefore, the sealing member S for blocking visible light is disposed so as to cover the side surface of the optically functional layer 300 including the wavelength conversion layer 320, the optical sheet layer 330 and the like, thereby preventing the above-described phenomenon.

The housing 100 may have a plate shape including a bottom surface 110 and a sidewall 120 connected to the bottom surface 110 to accommodate elements of the display device. The backlight unit 200 is disposed on the bottom surface 110 of the housing 100. The height of the sidewall 120 of the housing 100 is higher than the height of the backlight unit 200 disposed on the bottom surface 110 of the housing 100. Accordingly, the backlight unit 200 can be accommodated in a space defined by the bottom surface 110 and the sidewall 120 of the housing 100. The display panel 400 may be supported by the sidewall 120 of the housing 100.

The backlight unit 200 may include a circuit board 210, a plurality of light sources 220 and the light guide plate 230. The circuit board 210 may be disposed in close contact with the inside of the sidewall 120 of the housing 100. The plurality of light sources 220 may be mounted on the side surface of the circuit board 210 to emit light toward the inside of the housing 100. The plurality of light sources 220 may be LED devices emitting blue light, but the present disclosure is not limited thereto.

The light guide plate 230 may be disposed adjacent to one side of the circuit board 210 and the light source 220. The light guide plate 230 serves to guide a path of light emitted from the plurality of light sources 220. The light emitted from the light sources 220 may be provided through the light guide plate 230 to the optical function layer 300 and the display panel 400 disposed above the light guide plate 230. The light guide plate 230 may have a substantially polyhedral shape. Although it is illustrated in the drawing that the light guide plate 230 has a rectangular parallelepiped shape, the present disclosure is not limited thereto.

The backlight unit 200 is supported by the bottom surface 110 of the housing 100 while the display panel 400 to which the optically functional layer 300 is attached is supported by the sidewall 120 of the housing 100. Accordingly, the light guide plate 230 of the backlight unit 200 may be spaced apart from the optically functional layer 300 by a predetermined distance according to the height of the sidewall 120. In this case, the wavelength conversion material included in the optically functional layer 300 can be effectively protected from the heat of the light guide plate 230. However, the present disclosure is not limited thereto, and the light guide plate 230 and the optically functional layer 300 may be disposed in close contact with each other as described later.

Figure 3:
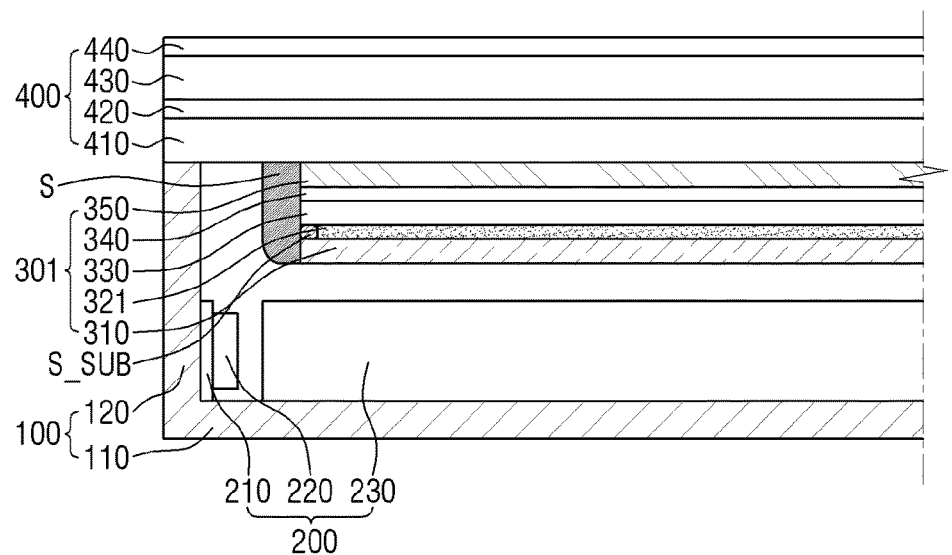
FIG. 3, FIG. 4, FIG. 5, FIG. 6, FIG. 7, FIG. 8, FIG. 9 and FIG. 10 are cross-sectional views of a display device according to other embodiments of the present disclosure.

FIG. 3 is a cross-sectional view of a display device according to another embodiment of the present disclosure.

The display device of FIG. 3 is the same as that described with reference to FIGS. 1 and 2 except that it further includes an auxiliary sealing member S_SUB disposed between a wavelength conversion layer 321 and the sealing member S. Hereinafter, a repeated description similar to the above description will be omitted, and a difference will be mainly described.

Referring to FIG. 3, the auxiliary sealing member S_SUB may be disposed to surround at least one side surface of the wavelength conversion layer 321 between the wavelength conversion layer 321 and the sealing member S. The wavelength conversion layer 321 may be disposed such that the side on which the auxiliary sealing member S_SUB is disposed is retracted inward from the optical sheet layer 330 and/or the protective layer 310 disposed above and below the wavelength conversion layer 321. That is, edges of the wavelength conversion layer 321 may be disposed inward than edges of the optical sheet layer 330 and/or the protective layer 310. Accordingly, a space may be interposed between the wavelength conversion layer 321 and the sealing member S, and the auxiliary sealing member S_SUB may be disposed in the space. The auxiliary sealing member S_SUB may be partially filled in the space or may be tightly filled in the space. The auxiliary sealing member S_SUB may be in contact with all of the seal member S and the wavelength conversion layer 321 located on both sides, and the optical sheet layer 330 and the protective layer 310 located on the upper and lower sides.

The auxiliary sealing member S_SUB may have a viscosity lower than that of the sealing member S, or have adhesion strength higher than that of the sealing member S. Alternatively, the auxiliary sealing member S_SUB may have a low viscosity and high adhesion strength at the same time. The auxiliary sealing member S_SUB may include a polymer resin in the same manner as the sealing member S. In this case, the viscosity may be lower than that of the polymer resin included in the sealing member S or adhesion strength of the polymer resin included in the auxiliary sealing member S_SUB may be higher than that of the polymer resin included in the sealing member S.

The sealing member S may be made of a polymer resin having a high viscosity in order to effectively block the infiltration of oxygen/moisture or the transmission of visible light. However, since the polymer resin has a property that the adhesion strength is lowered as the viscosity is higher, the auxiliary sealing member S_SUB having a lower viscosity or higher adhesion strength than the sealing member S is disposed in contact with all of the wavelength conversion layer 321, the sealing member S, the protective layer 310 and the optical sheet layer 330, thereby enhancing the adhesion between the components.

The auxiliary sealing member S_SUB may be disposed to surround all side surfaces of the wavelength conversion layer 321 to enhance the adhesion strength of the sealing member S. However, the present disclosure is not limited thereto and the auxiliary sealing member S_SUB may be disposed on only some side surfaces, for example, two side surfaces parallel to each other.

Figure 4:
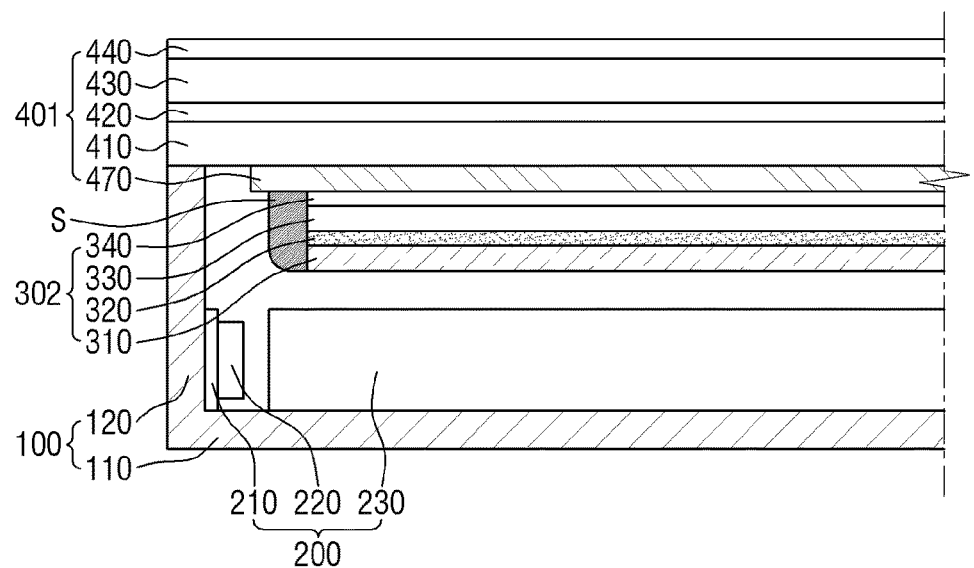

FIG. 4 is a cross-sectional view of a display device according to still another embodiment of the present disclosure.

The display device of FIG. 4 is the same as that described with reference to FIGS. 1 and 2 except that the sealing member S is not disposed on the side surface of a lower polarizing plate 470. Hereinafter, a repeated description similar to the above description will be omitted, and a difference will be mainly described.

Referring to FIG. 4, the lower polarizing plate 470 may be a part of a display panel 401 rather than a component included in an optically functional layer 302 and may be disposed such that at least one side thereof protrudes outward from the optical sheet layer 330, the wavelength conversion layer 320 and the like of the optical function layer 302. Thus, the lower polarizing plate 470 may not contact the sealing member S on its side surface, unlike the components of the optically functional layer 302. The upper surface of the sealing member S may be in contact with the lower surface of the lower polarizing plate 470 rather than the first substrate 410 of the display panel 401.

Figure 5:
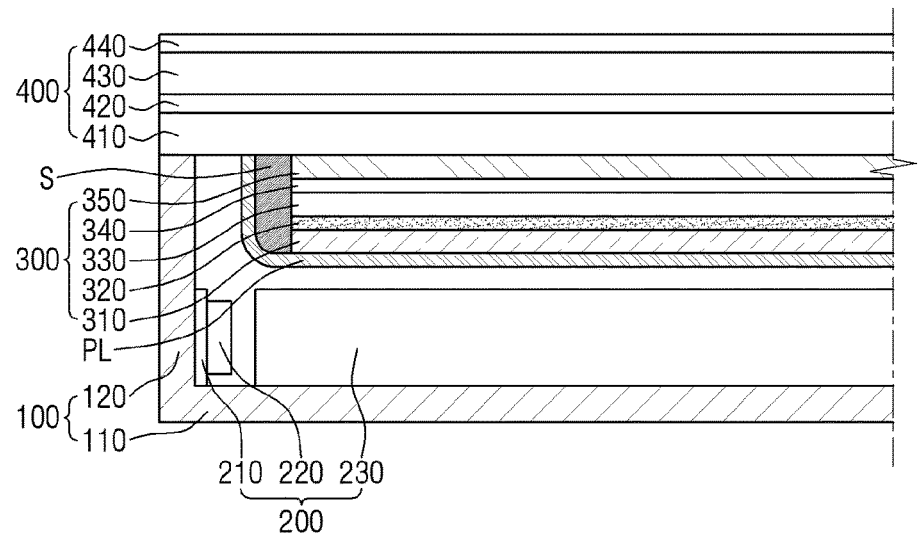

FIG. 5 is a cross-sectional view of a display device according to still another embodiment of the present disclosure.

The display device of FIG. 5 is the same as that described with reference to FIGS. 1 and 2 except that it further includes a passivation film PL covering the optically functional layer 300 and the sealing member S. Hereinafter, a repeated description similar to the above description will be omitted, and a difference will be mainly described.

Referring to FIG. 5, the passivation film PL may be disposed so as to cover the surfaces of the optically functional layer 300 and the sealing member S. That is, the passivation film PL may be disposed so as to completely cover the exposed surfaces of the optically functional layer 300 and the sealing member S, such as the lower and side surfaces of the sealing member S and the lower surface of the protective layer 310 of the optically functional layer 300.

Since the side surface of the display panel 400 may protrude outward from the optically functional layer 300 and also protrude outward from the sealing member S, the lower surface of the display panel 400 may be in contact with the upper surface of the passivation film PL.

The passivation film PL may include an inorganic material. Specifically, the passivation film PL may include at least one inorganic material of silicon oxide ($Si_xO_y$) and aluminum oxide ($Al_xO_y$), wherein x and y are positive integers and may be values allowing the oxides to have chemical formulas which can be established chemically. The passivation film PL may be a deposition layer formed by depositing an inorganic material including at least one of silicon oxide and aluminum oxide on the entire surfaces of the optically functional layer 300 and the sealing member S.

The passivation film PL may completely seal the optically functional layer 300 and the sealing member S, thereby more effectively protecting the wavelength conversion material included in the optically functional layer from oxygen/moisture. When the passivation film PL is formed by deposition of the inorganic material, the upper surface of the passivation film PL is attached to the lower surface of the display panel 400, so that the display panel 400, the passivation film PL and the optically functional layer 300 surrounded by the passivation film PL can be firmly fixed to each other.

Figure 6:
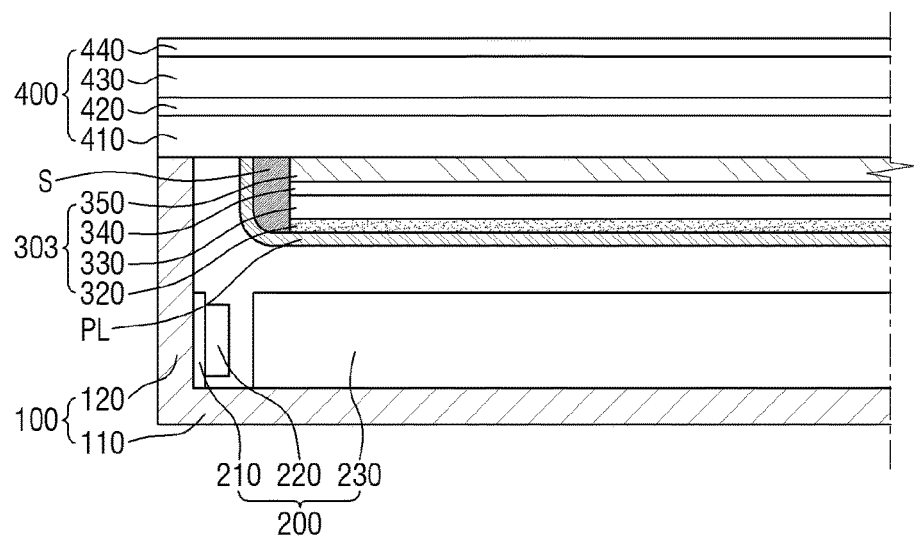

FIG. 6 is a cross-sectional view of a display device according to still another embodiment of the present disclosure.

The display device of FIG. 6 is the same as that described with reference to FIG. 5 except that it does not include the protective layer 310. Hereinafter, a repeated description similar to the above description will be omitted, and a difference will be mainly described.

Referring to FIG. 6, an optically functional layer 303 may not include the protective layer 310 disposed on the lower surface of the wavelength conversion layer 320. Since the passivation film PL covers and seals all the surfaces of the optically functional layer 303 and the sealing member S as described above with reference to FIG. 5, even if the protective layer 310 disposed between the wavelength conversion layer 320 and the passivation film PL is omitted as shown in FIG. 6, the wavelength conversion material in the wavelength conversion layer 320 can be effectively protected from oxygen/moisture.

Further, although not shown in the drawing, since it is possible to enhance the adhesion between the display panel 400 and the optically functional layer 303 when the upper surface of the passivation film PL is in contact with and attached to the lower surface of the display panel 400 as described above with reference to FIG. 5, the adhesive layer 340 disposed between the lower polarizing layer 350 and the optical sheet layer 330 may be omitted.

Figure 7:
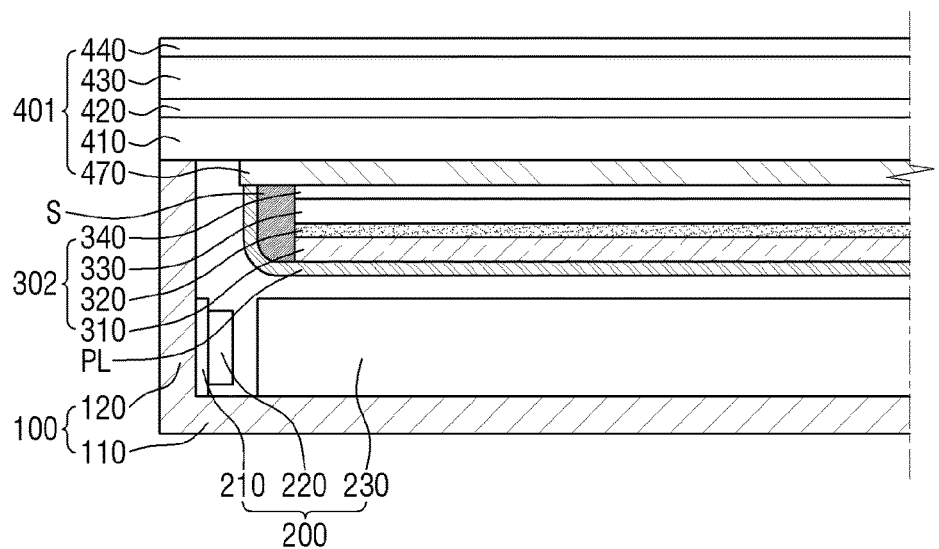

FIG. 7 is a cross-sectional view of a display device according to still another embodiment of the present disclosure.

The display device of FIG. 7 is the same as that described with reference to FIG. 5 except that the sealing member S is not disposed on the side surface of the lower polarizing plate 470. Hereinafter, a repeated description similar to the above description will be omitted, and a difference will be mainly described.

Referring to FIG. 7, the lower polarizing plate 470 may be a part of the display panel 401 rather than a component included in the optically functional layer 302 as shown in FIG. 4, and may be disposed such that at least one side thereof protrudes outward from the optical sheet layer 330, the wavelength conversion layer 320 and the like of the optically functional layer 302. Thus, similarly, the lower polarizing plate 470 may not be provided with the sealing member S on its side surface, unlike the components of the optically functional layer 302. The upper surfaces of the sealing member S and the passivation film PL may be in contact with the lower surface of the lower polarizing plate 470 rather than the first substrate 410 of the display panel 401.

Figure 8:
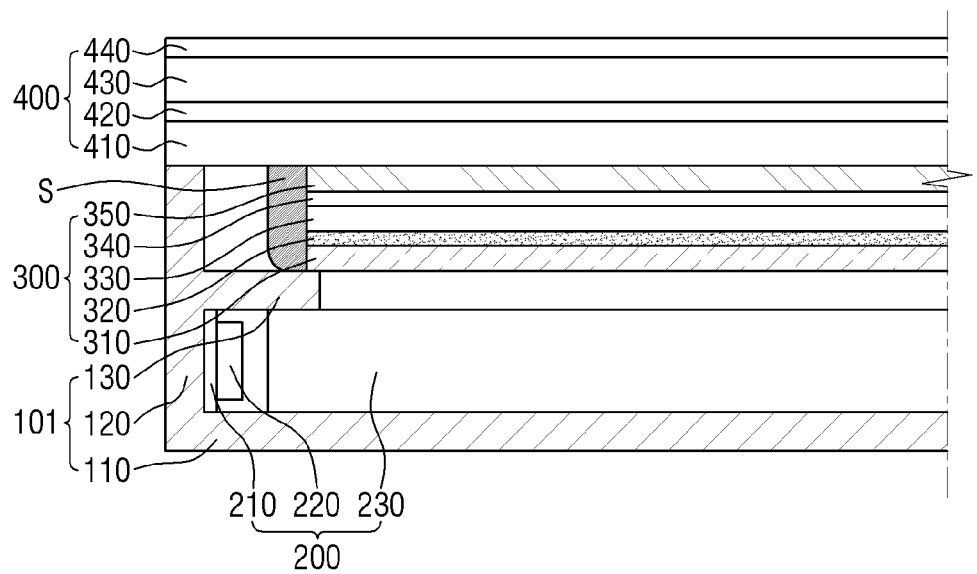

FIG. 8 is a cross-sectional view of a display device according to still another embodiment of the present disclosure.

The display device of FIG. 8 is the same as that described with reference to FIGS. 1 and 2 except that it further includes a support 130 formed in a housing 101. Hereinafter, a repeated description similar to the above description will be omitted, and a difference will be mainly described.

Referring to FIG. 8, the housing 101 may further include the support 130 extending inward from the sidewall 120, in addition to the bottom surface 110 and the sidewall 120. The support 130 may extend between the light guide plate 230 and the optically functional layer 300 to support the optically functional layer 300. Since the optically functional layer 300 can be supported by the support 130 while the display panel 400 is supported by the sidewall, even if the adhesion strength between the optically functional layer 300 and the display panel 400 is lowered to some extent, it is possible to prevent the optically functional layer 300 from being detached from the display panel 400.

Figure 9:
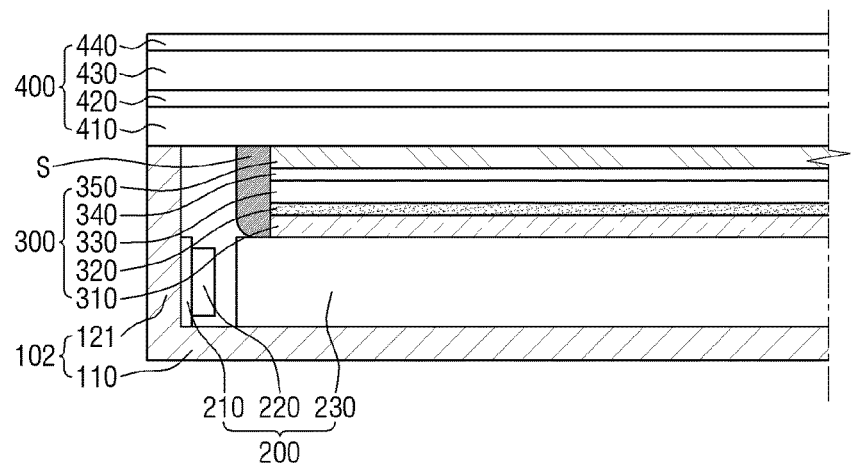

FIG. 9 is a cross-sectional view of a display device according to still another embodiment of the present disclosure.

The display device of FIG. 9 is the same as that described with reference to FIGS. 1 and 2 except that the light guide plate 230 is in contact with the optically functional layer 300. Hereinafter, a repeated description similar to the above description will be omitted, and a difference will be mainly described.

Referring to FIG. 9, the upper surface of the light guide plate 230 may be in contact with the lower surface of the optical function layer 300. Specifically, the upper surface of the light guide plate 230 may be in contact with the lower surface of the protective layer 310 of the optically functional layer 300. A sidewall 121 of a housing 102 may be formed at a lower height such that the light guide plate 230 and the optically functional layer 300 are in contact with each other. Accordingly, the thickness of the display device can be further reduced. Further, since the protective layer 310 is interposed between the wavelength conversion layer 320 and the light guide plate 230, the wavelength conversion material included in the wavelength conversion layer 320 may not be damaged by the heat of the light guide plate 230.

Figure 10:
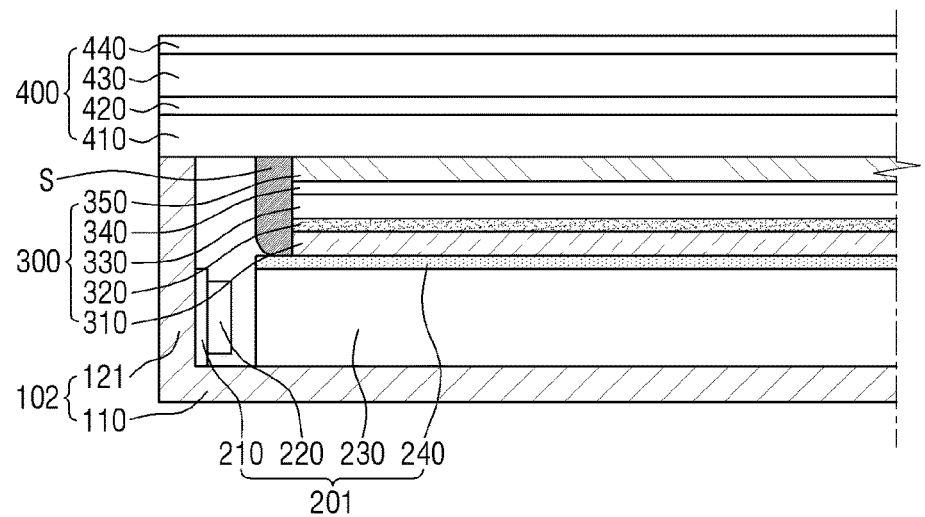

FIG. 10 is a cross-sectional view of a display device according to still another embodiment of the present disclosure.

The display device of FIG. 10 is the same as that described with reference to FIG. 9 except that it further includes a low refraction layer 240 disposed on the light guide plate 230. Hereinafter, a repeated description similar to the above description will be omitted, and a difference will be mainly described.

Referring to FIG. 10, the low refraction layer 240 having a refractive index lower than that of the light guide plate 230 may be disposed between the light guide plate 230 and the optically functional layer 300. The low refraction layer 240 is interposed between the light guide plate 230 and the optically functional layer 300 to promote total reflection of the light guide plate 230. The low refraction layer 240 may be formed directly on the upper surface of the light guide plate 230 so as to be in contact with the upper surface of the light guide plate 230 and the lower surface of the protective layer 310 of the optically functional layer 300.

In order for the light guide plate 230 to efficiently guide light, it is preferable that effective total reflection is performed inside the light guide plate 230. When the refractive index of the light guide plate 230 is larger than the refractive index of a medium that forms an optical interface with the light guide plate 230, a critical angle of the total reflection is reduced and more total internal reflection can be achieved. However, when the upper surface of the light guide plate 230 is in direct contact with the optically functional layer 300, it is more difficult to achieve sufficient total reflection than when an empty space is interposed between them. Therefore, by providing the low refraction layer 240 interposed between the light guide plate 230 and the optically functional layer 300 to form an interface with the upper surface of the light guide plate 230, total reflection can be performed on the upper surface of the light guide plate 230.

A difference between the refractive index of the light guide plate 230 and the refractive index of the low refraction layer 240 may be 0.2 or more. When the refractive index of the low refraction layer 240 is smaller than the refractive index of the light guide plate 230 by 0.2 or more, sufficient total reflection can be achieved through the upper surface of the light guide plate 230. Although there is no limitation on the upper limit of the difference between the refractive index of the light guide plate 230 and the refractive index of the low refraction layer 240, it may be 1 or less in consideration of the refractive index of the low refraction layer 240 and the material of the light guide plate 230, which are generally used.

The refractive index of the low refraction layer 240 may range from 1.2 to 1.4. Generally, as the refractive index of a solid medium becomes closer to 1, the manufacturing cost exponentially increases. When the refractive index of the low refraction layer 240 is 1.2 or more, an excessive increase in manufacturing cost can be avoided. Also, the refractive index of the low refractive layer 240 is 1.4 or less, which is advantageous in sufficiently reducing the total reflection critical angle of the upper surface of the light guide plate 230. In an exemplary embodiment, the low refraction layer 240 having a refractive index of about 1.25 may be applied.

FIGS. 11 to 16 are cross-sectional views showing the steps of a manufacturing method of the display device shown in FIGS. 1 and 2.

Figure 11:
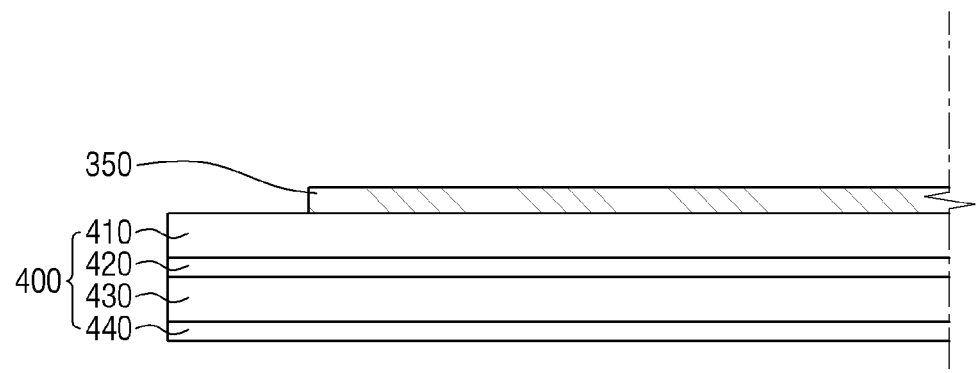
FIG. 11, FIG. 12, FIG. 13, FIG. 14, FIG. 15, FIG. 16 and FIG. 17 are cross-sectional views showing the steps of a manufacturing method of the display device shown in FIGS. 1 and 2 and the display device shown in FIG. 5.

First, referring to FIG. 11, the lower polarizing layer 350 is formed on the display panel 400. The display panel 400 may be formed by stacking the first substrate 410 including a thin film transistor element, the liquid crystal layer 420, the second substrate 430 including a color filter, and the upper polarizing layer 440. A more specific manufacturing method is commonly known and thus will be omitted. The lower polarizing layer 350 may be formed in a state where the display panel 400 is turned upside down. Accordingly, the lower polarizing layer 350 can be formed on the first substrate 410 of the display panel 400.

Figure 12:
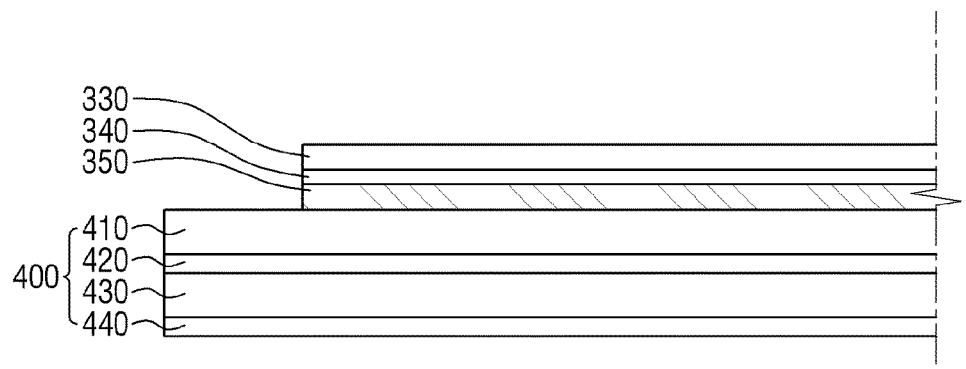

Then, referring to FIG. 12, the optical sheet layer 330 is formed on the lower polarizing layer 350. The optical sheet layer 330 may be attached and fixed on the lower polarizing layer 350 through the adhesive layer 340. The optical sheet layer 330 may be a laminate of a prism film, a light scattering film and the like, and the adhesive layer 340 may be an OCA, OCR, PSA or the like as described above.

Figure 13:
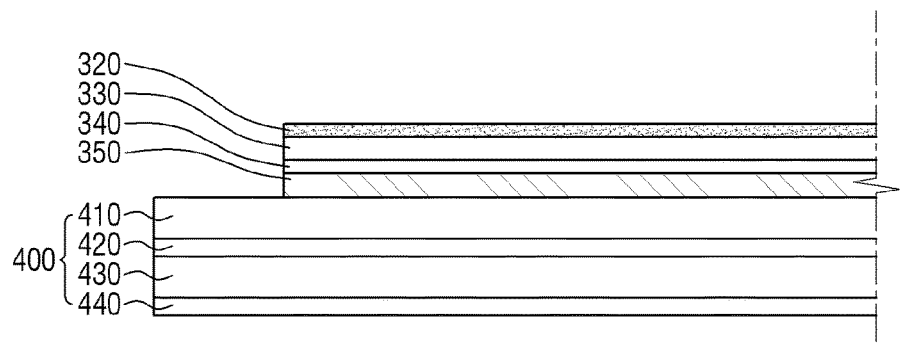

Then, referring to FIG. 13, the wavelength conversion material is coated on the optical sheet layer 330 to form the wavelength conversion layer 320. Specifically, the wavelength conversion layer 320 may be formed by coating a solution in which the wavelength conversion material is mixed with a solvent. The wavelength conversion material may be a quantum dot, and a detailed description of the quantum dot is omitted since it is similar to that described above.

Figure 14:
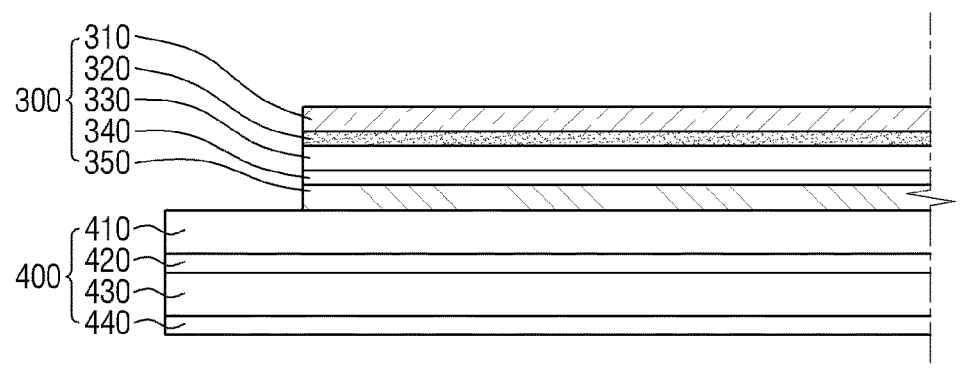

Then, referring to FIG. 14, the protective layer 310 is formed on the wavelength conversion layer 320.

Figure 15:
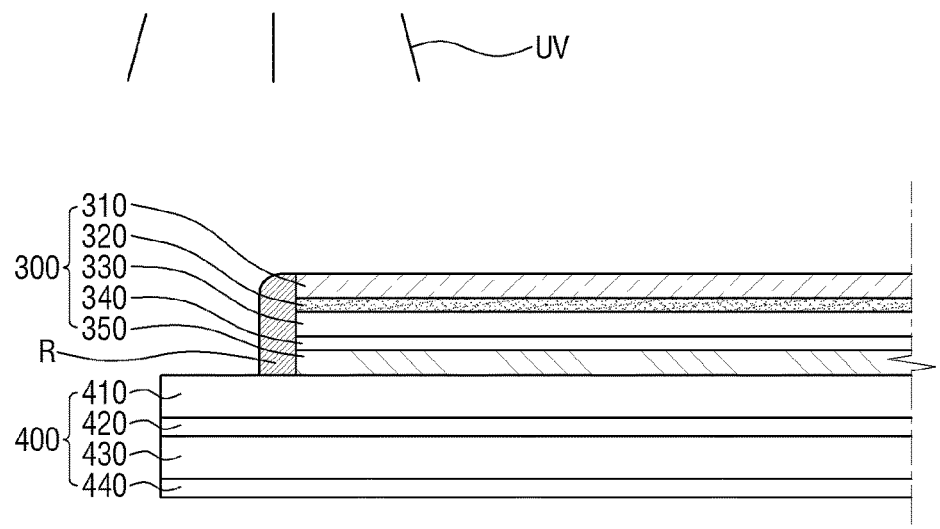
Figure 16:
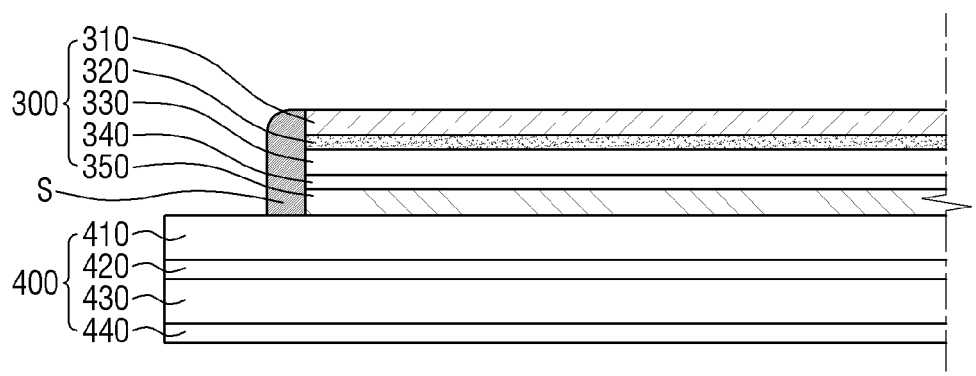

Then, referring to FIGS. 15 and 16, a sealing material R is applied to the side surface of the optically functional layer 300 and then cured to form the sealing member S. The sealing material R may be an ultraviolet (UV) curable polymer resin. The sealing material R can be cured by irradiating ultraviolet rays on the sealing material R. If necessary, by using a light shielding mask, it is possible to prevent ultraviolet rays from being irradiated on elements other than the sealing material R.

Then, the display panel 400 to which the optically functional layer 300 is attached is coupled with the housing 100 accommodating the backlight unit 200, thereby manufacturing the display device as shown in FIGS. 1 and 2.

FIGS. 11 to 17 are cross-sectional views showing the steps of a manufacturing method of the display device shown in FIG. 5.

Referring to FIGS. 11 to 16, the optically functional layer 300 and the sealing member S are formed on one surface of the display panel 400, and a description thereof will be omitted since it has been described in detail.

Figure 17:
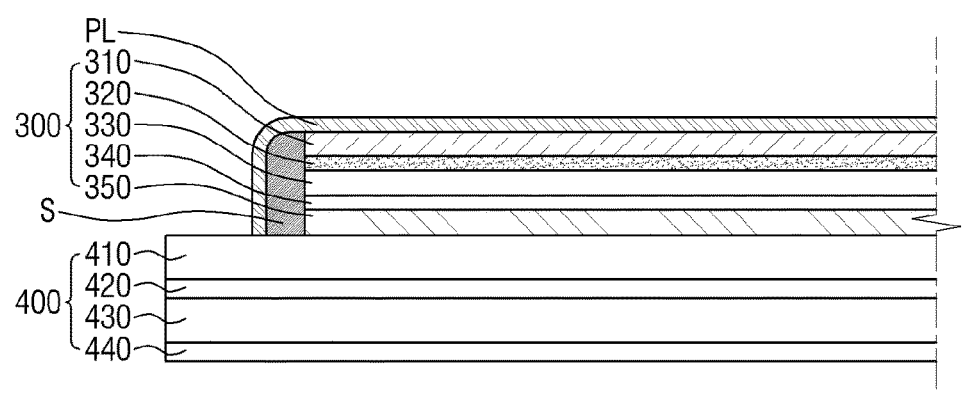

Then, referring to FIG. 17, the passivation film PL is formed by depositing an inorganic material so as to cover the optically functional layer 300 and the sealing member S. The inorganic material may include at least one of silicon oxide and aluminum oxide. The passivation film PL may be formed by depositing the oxide(s) on the entire surfaces of the optically functional layer 300 and the sealing member S.

Then, the display panel 400 to which the optically functional layer 300 is attached is coupled with the housing 100 accommodating the backlight unit 200, thereby manufacturing the display device as shown in FIG. 5.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device comprising:
    an optically functional layer including a wavelength conversion material;
    a sealing member surrounding a side surface of the optically functional layer;
    a display panel disposed on the optically functional layer and having at least one side which protrudes outward from an edge of the optically functional layer and an edge of the sealing member,
    wherein the sealing member is disposed such that at least a portion of the sealing member is in contact with a lower surface of the protruding portion of the display panel,
    wherein the sealing member includes a light shielding material that substantially blocks visible light,
    wherein the optically functional layer includes:
    a protective layer; and
    a wavelength conversion layer disposed between the protective layer and the display panel and including the wavelength conversion material, and
    wherein the optically functional layer further includes:
    an optical sheet layer disposed between the wavelength conversion layer and the display panel and including a laminate of at least one of a polarizing film, a prism film and a light scattering film.

2. The display device of claim 1, further comprising:
    an auxiliary sealing member disposed between the sealing member and the wavelength conversion layer to surround at least one side surface of the wavelength conversion layer, the auxiliary sealing member being in contact with the sealing member, the wavelength conversion layer and the protective layer.

3. The display device of claim 2, wherein the auxiliary sealing member has a viscosity lower than that of the sealing member.

4. The display device of claim 1, further comprising a passivation film disposed to cover exposed surfaces of the optically functional layer and the sealing member.

5. The display device of claim 4, wherein the one side of the display panel protrudes outward from the sealing member, and
    wherein the passivation film is disposed such that at least a portion of the passivation film is in contact with a lower surface of the protruding portion of the display panel.

6. The display device of claim 4, wherein the passivation film includes silicon oxide (SixOy) and/or aluminum oxide (AlxOy).

7. The display device of claim 1, wherein the wavelength conversion material includes a quantum dot.

8. The display device of claim 1, wherein the light shielding material includes a black polymer resin.

9. The display device of claim 1, wherein the sealing member includes a material having adhesive property.

10. A display device comprising:
    a backlight unit including a light source and a light guide plate disposed on one side of the light source;
    an optically functional layer disposed on the light guide plate and including a protective layer and a wavelength conversion layer disposed on the protective layer;
    a display panel disposed on the optically functional layer;
    a sealing member disposed to surround at least one side surface of the protective layer and the wavelength conversion layer, and
    a low refraction layer disposed between the light guide plate and the protective layer and having a refractive index lower than that of the light guide plate,
    wherein the sealing member includes a light shielding material that substantially blocks visible light and the display panel includes at least one side which protrudes outward from an edge of the sealing member.

11. The display device of claim 10, wherein the wavelength conversion layer includes a quantum dot.

12. The display device of claim 11, further comprising a passivation film disposed to cover exposed surfaces of the optically functional layer and the sealing member.

13. The display device of claim 10, wherein the light shielding material includes a black polymer resin.

14. A manufacturing method of a display device, comprising:
    preparing a display panel on which a display element including a thin film transistor is mounted;
    attaching, on the display panel, at least one optical sheet selected from the group consisting of an anti-reflection film, a prism film and a light scattering film;
    forming a wavelength conversion layer by coating a wavelength conversion material on the optical sheet;
    forming a protective layer on the wavelength conversion layer;
    coating a curable resin to cover side surfaces of the optical sheet, the wavelength conversion layer and the protective layer; and
    curing the curable resin to form a sealing member.

15. The manufacturing method of claim 14, further comprising forming a passivation film to cover exposed surfaces of the protective layer and the sealing member by depositing an inorganic material.

16. The manufacturing method of claim 15, wherein the inorganic material includes silicon oxide (SixOy) and/or aluminum oxide (AlxOy).

17. The manufacturing method of claim 14, wherein the wavelength conversion material includes a quantum dot.

18. The manufacturing method of claim 14, wherein the curable resin includes a black photo-curable resin.

* * * * *